United States Patent [19]
Bennett et al.

[11] Patent Number: 5,773,485
[45] Date of Patent: Jun. 30, 1998

[54] ACRYLIC SYRUP CURABLE TO A CROSSLINKED VISCOELASTOMERIC MATERIAL

[75] Inventors: Greggory S. Bennett, Hudson, Wis.; Louis E. Winslow, Stillwater; Gaddam N. Babu, Woodbury, both of Minn.

[73] Assignee: Minnesota Mining and Manufacturing Company, St. Paul, Minn.

[21] Appl. No.: 522,294

[22] PCT Filed: Jul. 28, 1995

[86] PCT No.: PCT/US95/09502

§ 371 Date: Aug. 23, 1995

§ 102(e) Date: Aug. 23, 1995

Related U.S. Application Data

[63] Continuation-in-part of Ser. No. 282,058, Jul. 29, 1994, abandoned.

[51] Int. Cl.$^6$ .......................... C08F 2/50; C08F 216/36; C08J 131/02

[52] U.S. Cl. .................................. 522/8; 522/12; 522/35; 522/114; 522/121; 522/125; 522/904; 522/905; 526/208; 526/316

[58] Field of Search .................................. 522/120, 121, 522/904, 905, 8, 12, 35, 114, 125; 526/208, 316

[56] References Cited

U.S. PATENT DOCUMENTS

| | | | |
|---|---|---|---|
| Re. 24,906 | 12/1960 | Ulrich | 206/59 |
| 3,565,247 | 2/1971 | Brochman | 206/59 |
| 3,575,925 | 4/1971 | Skoultchi | 260/47 |
| 3,615,972 | 10/1971 | Morehouse, Jr. et al. | 156/79 |
| 3,993,833 | 11/1976 | Esmay | 428/311 |
| 4,075,238 | 2/1978 | Mark et al. | 260/458 |
| 4,144,157 | 3/1979 | Guse et al. | 204/159.23 |
| 4,181,752 | 1/1980 | Martens et al. | 427/54.1 |
| 4,181,755 | 1/1980 | Liu et al. | 430/314 |
| 4,223,067 | 9/1980 | Levens | 428/308 |
| 4,243,500 | 1/1981 | Glennon | 204/159.12 |
| 4,287,308 | 9/1981 | Nakayama et al. | 521/53 |
| 4,303,485 | 12/1981 | Levens | 204/159.24 |
| 4,329,384 | 5/1982 | Vesley et al. | 428/40 |
| 4,330,590 | 5/1982 | Vesley | 428/336 |
| 4,364,972 | 12/1982 | Moon | 427/54.1 |
| 4,379,201 | 4/1983 | Heilmann | 428/345 |
| 4,391,687 | 7/1983 | Vesley | 204/159.16 |
| 4,415,615 | 11/1983 | Esmay et al. | 428/40 |
| 4,710,536 | 12/1987 | Klingen et al. | 524/493 |
| 4,732,808 | 3/1988 | Krampe et al. | 428/355 |
| 4,737,559 | 4/1988 | Kellen et al. | 526/291 |
| 4,749,590 | 6/1988 | Klingen et al. | 427/54.1 |
| 4,818,610 | 4/1989 | Zimmerman | 428/345 |
| 4,894,259 | 1/1990 | Kuller | 427/208.8 |
| 4,895,738 | 1/1990 | Zimmerman et al. | 427/208.8 |
| 4,914,004 | 4/1990 | Köhler et al. | 430/272 |
| 4,922,004 | 5/1990 | Köhler et al. | 560/221 |
| 4,977,293 | 12/1990 | Hatton et al. | 558/153 |
| 5,026,806 | 6/1991 | Rehmer et al. | 526/316 |
| 5,073,611 | 12/1991 | Rehmer et al. | 526/208 |
| 5,128,386 | 7/1992 | Rehmer et al. | 522/35 |
| 5,180,756 | 1/1993 | Rehmer et al. | 522/35 |
| 5,202,361 | 4/1993 | Zimmerman et al. | 522/120 |
| 5,248,805 | 9/1993 | Boettcher et al. | 558/270 |
| 5,264,533 | 11/1993 | Rehmer et al. | 526/301 |
| 5,302,629 | 4/1994 | Berejka | 523/111 |
| 5,334,447 | 8/1994 | Kitamura et al. | 428/317.3 |
| 5,506,279 | 4/1996 | Babu et al. | 522/34 |

FOREIGN PATENT DOCUMENTS

| | | |
|---|---|---|
| 674 420 | 5/1966 | Belgium . |
| 675420 | 4/1971 | Belgium . |
| 0 281 941 | 9/1988 | European Pat. Off. . |
| 0 373 662 | 5/1990 | European Pat. Off. . |
| 0 395 987 | 11/1990 | European Pat. Off. . |
| 43 03 183 | 7/1994 | Germany . |
| 58-046236 | 3/1983 | Japan . |
| 61-083273 | 4/1986 | Japan . |
| 2-248482 | 10/1990 | Japan . |
| 91-090724 | 2/1991 | Japan . |
| 3-250031 | 11/1991 | Japan . |
| 2-235908 | 9/1992 | Japan . |
| 6-172729 | 12/1992 | Japan . |
| 6-166858 | 6/1994 | Japan . |
| 6-200225 | 7/1994 | Japan . |
| WO 93/09152 | 5/1993 | WIPO . |
| 93/20164 | 10/1993 | WIPO . |
| 94/13750 | 6/1994 | WIPO . |
| WO 94/14853 | 7/1994 | WIPO . |

OTHER PUBLICATIONS

M. Koehler et al., "Coreactive Photoinitiators", pp. 1–5, *Polym. Mater. Sci. Eng.*, vol. 60, 1989.

*Primary Examiner*—Susan W. Berman
*Attorney, Agent, or Firm*—Gary L. Griswold; Walter N. Kirn; Harold C. Knecht, III

[57] ABSTRACT

Solute polymers in solvent monomers form a coatable syrup that can be cured to a viscoelastomeric material when radiation-sensitive hydrogen abstracting groups in either the polymer or one of the monomers are exposed to ultraviolet radiation. The solute polymers can be formed from the solvent monomers.

14 Claims, No Drawings

ACRYLIC SYRUP CURABLE TO A CROSSLINKED VISCOELASTOMERIC MATERIAL

This application is a Continuation-in-Part of U.S. Ser. No. 08/282,058 filed Jul. 29, 1994, currently abandoned.

BACKGROUND OF THE INVENTION

1. Field of the Invention

This invention describes a viscoelastomeric material with high shear at ambient and elevated temperatures prepared from a blend of ethylenically unsaturated monomers. A process for making this material is also described.

2. Background Information

Pressure sensitive adhesives (PSAs) made by photopolymerizing an alkyl acrylate and a polar copolymerizable monomer are known in the art. See, e.g., U.S. Pat. Nos. RE 24,906; 4,181,755; 4,364,972; and 4,243,500. Acrylic-based PSAs exhibit good adherence to high energy (i.e., polar) substrates such as metal and painted steel surfaces but generally exhibit lower adhesion to low energy (i.e., nonpolar) substrates such as polyethylene and polypropylene.

Solvent-processed acrylic PSA compositions can be crosslinked by adding a polyfunctional crosslinking agent that reacts with a reactive group present in the polymer. See, e.g., Japanese Kokoku 58[1983]-046236 in which is described a solvent-processed crosslinked acrylic PSA with excellent cohesion that is the reaction product of (a) a polyisocyanate, prepared by reacting (1) an acrylic copolymer having a molecular weight between 1,000 and 30,000 and from 1.7 to 5.0 functional groups that can react with an isocyanate group with (2) a diisocyanate, so that the ratio of isocyanate groups per coreactive functional group is about 2:1, and (b) an adherent copolymer comprising functional groups that can react with an isocyanate group. Like any solvent processing technique, however, the preparation of thick adhesives is difficult because the solvent causes bubbling in the adhesive and the emission of solvent vapors into the atmosphere is undesirable.

To avoid environmental pollution, manufacturing processes that do not require the use of volatile solvents have become of great interest. An early step in this direction for the manufacture of PSA tape was the process described in Belgium Patent No. 675,420. In this process, flexible carriers are coated with acrylic monomers, or mixtures of such monomers with copolymerizable compounds, with the possible addition of a thickening and/or initiating agent, and the monomers are polymerized directly on the carrier using ultraviolet radiation.

Hot melt coating a PSA composition eliminates the necessity of solvent processing. To hot melt process an adhesive composition, the composition must be uncrosslinked during the coating process; however, to achieve a PSA with balanced properties (i.e., peel and shear adhesion), the composition must be crosslinked. In hot melt coating processes, this is usually done by exposure to high energy radiation (e.g., E-beam or high intensity ultraviolet radiation). When high intensity ultraviolet radiation is used, a photoactive crosslinking species such as benzophenone is generally added to the composition. However, thicker sections of PSA compositions cannot be cured this way.

A more efficient method of photocrosslinking involves incorporating hydrogen abstracting moieties into the polymer backbone prior to coating. Such polymers can be hot melt coated and subsequently cured by conventional irradiation techniques. This process is typified by U.S. Pat. No. 4,737,599 where a PSA with good adhesion to skin is described. That process is much more efficient than the high intensity irradiation method described immediately above.

The cohesive strength of an acrylic PSA can be increased without unduly affecting its compliance by utilizing a photoactive crosslinking agent in conjunction with a photo initiator. See, e.g., U.S. Pat. Nos. 4,181,752; 4,329,384; 4,330,590; 4,391,687, and 5,202,361. Useful photoactive crosslinking agents include various aldehydes, quinones, and particularly certain chromophore-substituted halomethyl-s-triazines (because they provide desirably shortened reaction times and somewhat greater tolerance to oxygen over the non-halomethyl-containing agents), although their use can result in evolution of HCl during polymerization.

An ultraviolet (UV) radiation-curable composition that includes 20 to 99% (by wt.) of a copolymer of ethylenically unsaturated monomers, 1 to 80% (by wt.) ethylenically unsaturated monomers, and 0 to 20% (by wt.) of one or more polyethylenically unsaturated compounds is described in U.S. Pat. No. 5,180,756.

Copolymerizable photoinitiators such as 2-[4-(2-hydroxy-2,2-dimethyl-1-oxopropyl)phenoxy]ethyl 2-propenoate and their use in the polymerization of ethylenically unsaturated compounds is disclosed in U.S. Pat. No. 4,922,004.

Japanese Kokai 2[1990]-248482 describes a photocurable PSA obtained by reacting (a) 30 to 50 parts by weight (pbw) of a copolymer of an acrylic acid alkyl ester, a copolymerizable ethylenically unsaturated monomer having a polar group, and a copolymerizable monomer with a photosensitizing group (such as 2-acryloyloxybenzophenone or 1-acryloyloxy-2-[4-(4-chlorobenzoyl)benzoyl-oxy]ethane); (b) 40 to 60 pbw of an aryloxy acrylic monomer such as phenoxyethyl acrylate or nonylphenoxyethyl acrylate; and (c) a tackifying resin. The composition is cured using a total dose of energy of 300 to 800 $mJ/cm^2$ from a high pressure mercury lamp. Such high intensity ultraviolet radiation is likely to produce an adhesive that has a shear value less than 100 minutes.

Similarly, DE, 42 03 183 Cl (Germany) discloses a method for producing PSA layers comprising the steps of thickening a monomer mixture that includes a photoinitiator with a separately made, solvent-free saturated UV-reactive polyacrylate; coating the thickened mixture onto a substrate; and irradiating the coated substrate. The separately made polymer comprises side chains that, when irradiated, participate in crosslinking reactions. The sole example involves the addition of a commercially available polymer having a molecular weight of about 200,000 to a monomer mixture that is then polymerized.

The shear values of PSAs prepared by actinically irradiating acrylic monomers can be enhanced by the addition of polyacrylic crosslinking agents. See, e.g., U.S. Pat. No. 4,379,201. Such PSAs involve networks and are sensitive to processing conditions.

A composition that can be radiation cured to provide thick, high molecular weight PSA compositions with outstanding properties has not been previously described.

SUMMARY OF THE INVENTION

Briefly, the present invention provides a syrup, preferably a syrup of a coatable viscosity, curable to a crosslinked viscoelastomeric material comprising:

a) about 65 to 99.9 weight percent, preferably about 90 to 99 weight percent, of a solvent monomer mixture comprising about 95 to 99.9999 pbw, preferably 97 to 99.995 pbw, of at least one free radically-polymerizable ethylenically unsaturated monomer and 0.0001 to 5 pbw, preferably 0.005 to 3 pbw, of an ethylenically unsaturated monomer comprising a radiation-sensitive hydrogen abstracting group;

b) about 0.1 to 35 weight percent, preferably about 1 to 10 weight percent, of a solute polymer having a molecular weight of at least 500,000, which polymer comprises about 95 to 99.999 weight percent mer units derived from one or more free radically-polymerizable ethylenically unsaturated monomers and about 0.001 to 5 weight percent mer units derived from an ethylenically unsaturated monomer comprising a radiation-sensitive hydrogen abstracting group;

c) from 0 to 5 pbw, preferably 0.01 to 0.30 pbw, of a free radically-polymerizable polyethylenically unsaturated monomer; and d) from 0.0001 to 3 pbw, preferably 0.001 to 1.0 pbw, of a saturated energy-activated initiator of polymerization (i.e., an energy-activated initiator of polymerization that is free of ethylenic unsaturation).

In another aspect, the present invention provides a process for making a crosslinked viscoelastomeric material comprising the steps:

a) providing a composition comprising a solvent monomer mixture comprising at least one free radically-polymerizable ethylenically unsaturated monomer and 0.0001 to 5 pbw, preferably 0.005 to 3 pbw, of an ethylenically unsaturated monomer comprising a radiation-sensitive hydrogen abstracting group and 0.0001 to 3 pbw, preferably 0.001 to 0.5 pbw, of a saturated energy-activated initiator of polymerization, preferably a saturated radiation-activated initiator of polymerization;

b) exposing the composition to energy, preferably radiative energy, so as to partially polymerize the monomer mixture and form a coatable syrup;

c) adding to the syrup, based on the total amount of monomer initially present in the monomer mixture, 0 to 3 pbw, preferably 0.001 to 0.5 pbw, of a saturated energy-activated initiator of polymerization, preferably a saturated radiation-activated initiator of polymerization; 0 to 3 pbw of an ethylenically unsaturated monomer comprising a radiation-sensitive hydrogen abstracting group; and/or 0 to 5 pbw, preferably 0.01 to 0.30 pbw, of a polyethylenically unsaturated monomer; and d) exposing the syrup to energy that activates the initiator and the radiation-sensitive hydrogen abstracting group so as to form the crosslinked viscoelastomeric material.

The crosslinked viscoelastomeric material produced from the above syrup is also described. The syrup optionally can be coated on a substrate prior to being irradiated, and such articles are also described.

The coatable syrup of the present invention is polymerizable to a viscoelastomeric material that can be crosslinked directly or hot-melt coated (for example, when no polyethylenically unsaturated monomer is present) and then crosslinked. The viscoelastomeric material is preferably a PSA having high shear at both ambient and elevated temperatures. This syrup comprises a solute polymer in a solvent monomer mixture. The polymer preferably has a very high molecular weight, preferably at least 500,000, more preferably at least 750,000, even more preferably at least 1,000,000, most preferably at least 1,500,000. One or both of the polymer and monomer contains at least one radiation-sensitive hydrogen abstracting group that, upon exposure to UV radiation, is activated to enable curing. The cured product is a crosslinked viscoelastomeric material.

The polymer of the syrup of the present invention contains side chains that comprise radiation-sensitive hydrogen abstracting groups activatable by UV radiation, resulting in a crosslinked viscoelastomeric product (i.e., essentially one crosslinked macromolecule, not an interpenetrating network).

Where no ethylenically unsaturated monomer comprising a radiation-sensitive hydrogen abstracting group is present in the initial monomer mixture, some polymer that includes side chains comprising the aforementioned radiation-sensitive hydrogen abstracting groups or some monomer that contains a radiation-sensitive hydrogen abstracting group must be added to the syrup prior to formation of the viscoelastomeric material therefrom, i.e., polymerization of the monomer(s) of the monomer mixture. Preferably, however, the solute polymer is prepared in situ, i.e., directly from the solvent monomer mixture. This eliminates the need for solubilizing a separately made polymer in a monomer mixture and allows very high molecular weight polymers to be formed and solubilized.

Crosslinked viscoelastomeric materials produced from the syrup of the present invention can be used as PSAs, vibration damping materials, transfer adhesives, structural adhesives, protective coatings, and the like. Advantageously, the syrup of the present invention can have a coatable viscosity and can therefore be applied to a substrate prior to curing, thus allowing for the simple production of articles comprising one or more layers of the aforementioned viscoelastomeric material.

Unless otherwise indicated, the following definitions apply in this application:

"group" or "compound" or "monomer" or "polymer" means, unless otherwise noted, a chemical species that can be substituted by conventional substituents that do not interfere with the desired product; and "(meth)acrylic" refers to acrylate, methacrylate, acrylamide, and methacrylamide compounds, as well as alkyl and aryl compounds that have been substituted with an acrylate or methacrylate group.

DETAILED DESCRIPTION OF PREFERRED EMBODIMENTS

The syrup of the present invention comprises from about 65 to 99.9 weight percent, preferably from about 90 to 99 weight percent, more preferably from about 93 to 97 weight percent of a solvent monomer mixture and from about 0.1 to 35 weight percent, preferably from about 1 to 10 weight percent, more preferably from about 3 to 7 weight percent of a solute polymer.

In the syrup of the present invention, the solute polymers and the solvent monomer mixtures are based, in substantial part, on free radically-polymerizable ethylenically unsaturated monomers. Ethylenically unsaturated monomers that do not contain a radiation-sensitive hydrogen abstracting group comprise from about 95 to 99.9999 pbw, preferably 97 to 99.995 pbw, of the monomer mixture. From 95 to 99.999% (by wt.) of the mer units of the solute polymer also are derived from such monomers. Preferred free radically-polymerizable ethylenically unsaturated monomers are (meth)acrylic acid and its numerous well known derivatives.

Particularly preferred among such monomers are monoethylenically-unsaturated monomers that are homopolymerizable to a polymer with a glass transition temperature ($T_g$) less than about 0° C. (hereinafter "A monomers"). These monomers preferably constitute from about 50 to 99.9999 pbw, more preferably from about 60 to 95 pbw, of the solvent monomer mixture of the syrup of the present invention. Common examples of A monomers include (meth)acrylic acid esters of monohydric alcohols. Preferred among these are monofunctional esters of non-tertiary alcohols, particularly primary alcohols. Those (meth)acrylic acid esters wherein the alkyl portion of the ester contains from 4 to about 12 carbon atoms have been found to be especially useful. Such monomers include, but are not limited to, isooctyl acrylate, butyl acrylate, hexyl acrylate, 2-ethylhexyl acrylate, isononyl acrylate, decyl acrylate, and dodecyl acrylate.

Monethylenically unsaturated monomers that are homopolymerizable to a polymer with a $T_g$ greater than about 50° C. (hereinafter "B monomers") can also be included in the free radically-polymerizable ethylenically unsaturated portion of the monomer mixture of the composition of the present invention. B monomers, when present, preferably constitute from about 0.1 to about 50 pbw, more preferably from about 5 to about 40 pbw of the monomer mixture. Examples of useful B monomers include, but are not limited to, (meth)acrylic acid, itaconic acid, substituted (meth)acrylamides such as N,N-dimethylacrylamide and N-octylacrylamide, N-vinyl pyrrolidone, N-vinyl caprolactam, acrylonitrile, tetrahydrofurfiryl acrylate, isobornyl acrylate, abitol acrylate, and dicyclopentadienyl acrylate.

Ethylenically unsaturated monomers that comprise a radiation-sensitive hydrogen abstracting group and that are copolymerizable with the aforementioned free radically-polymerizable ethylenically unsaturated monomers (hereinafter "C monomers") can constitute from 0.0001 to about 5 pbw, preferably 0.005 to 3 pbw, of the solvent monomer mixture of the syrup of the present invention. Monomers that comprise a radiation-sensitive hydrogen abstracting group are thought to promote crosslinking of the backbone chain of the polymer (as opposed to formation of pendent polymer chains). Preferred C monomers include ethylenically unsaturated compounds having the general formula

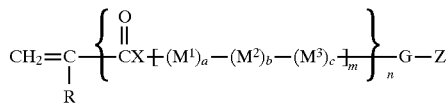

wherein

R is H or a $C_1$ to $C_3$ alkyl group, preferably H or a methyl group;

X is O or NH;

n is 0 or 1;

m is 0 or an integer from 1 to 5;

a, b, and c are independently 0 or 1;

$M^1$ is $CH_2$ or $SiR^1R^2$;

$M^2$ is $CR^3R^4$ or $SiR^1R^2$;

$M^3$ is O, NH, C(O), C(O)O, C(O)NH, or OC(O)NH;

$R^1$ and $R^2$ are independently H or a $C_1$ to $C_4$ alkyl group;

$R^3$ and $R^4$ are independently H, an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic O heteroatoms, or $R^3$ and $R^4$ taken together with the carbon to which they are attached form a carbocyclic ring containing 4 to 12 ring atoms;

G is a covalent bond, $(CH_2)_d$, or $(CH_2)_dO$ where d is an integer from 1 to 4, preferably from 1 to 2;

Z is a radiation-sensitive hydrogen abstracting group having the general formula

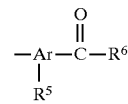

in which

Ar is a substituted arene having 6 to 12 carbon atoms, preferably a benzenetriyl group;

$R^5$ is hydrogen, a $C_1$ to $C_{12}$ alkyl group, a $C_1$ to $C_{12}$ alkoxy group, or a phenyl group; and $R^6$ is a $C_1$ to $C_6$ alkyl group, a cycloalkyl group having 3 to 14 carbon atoms, or

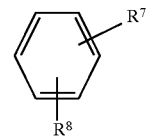

wherein $R^7$ and $R^8$ are independently selected from the class consisting of hydrogen, $C_1$ to $C_{12}$ alkyl groups, $C_1$ to $C_{12}$ alkoxy groups, and phenyl groups, with the proviso that, when $R^5$ and $R^7$ (or $R^8$) are ortho to the carbonyl group of Z, together they can be one of

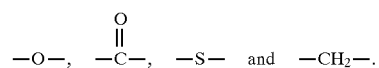

Preferably, where m is not 0, both $M^1$ and $M^2$ are not $SiR^1R^2$.

Included among those hydrogen abstracting C monomers encompassed by Formula I are those where Z is a moiety derived from one of the following compounds (or a substituted derivative thereof):

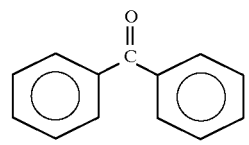

benzophenone

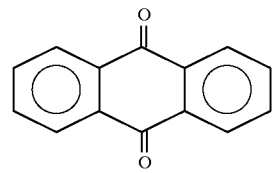

anthraquinone

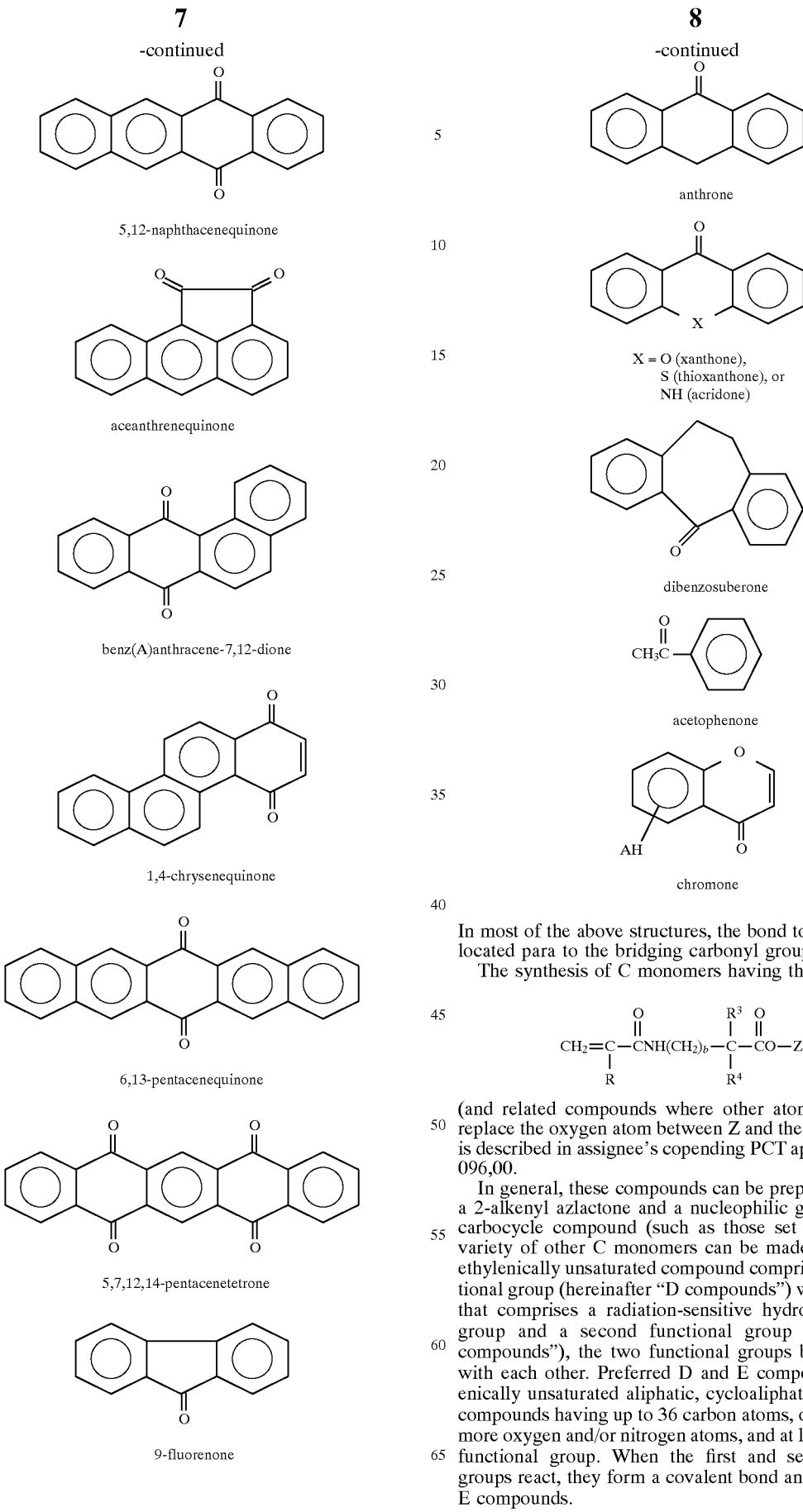

5,12-naphthacenequinone aceanthrenequinone benz(A)anthracene-7,12-dione 1,4-chrysenequinone 6,13-pentacenequinone 5,7,12,14-pentacenetetrone 9-fluorenone anthrone X = O (xanthone),
S (thioxanthone), or
NH (acridone)

dibenzosuberone acetophenone chromone

In most of the above structures, the bond to G is preferably located para to the bridging carbonyl group.

The synthesis of C monomers having the formula

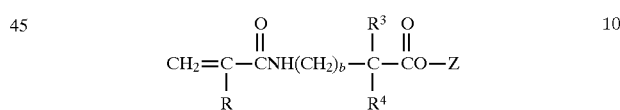

(and related compounds where other atoms and moieties replace the oxygen atom between Z and the carbonyl group) is described in assignee's copending PCT application US95/096,00.

In general, these compounds can be prepared by reacting a 2-alkenyl azlactone and a nucleophilic group-substituted carbocycle compound (such as those set forth above). A variety of other C monomers can be made by reacting an ethylenically unsaturated compound comprising a first functional group (hereinafter "D compounds") with a compound that comprises a radiation-sensitive hydrogen abstracting group and a second functional group (hereinafter "E compounds"), the two functional groups being coreactive with each other. Preferred D and E compounds are ethylenically unsaturated aliphatic, cycloaliphatic, and aromatic compounds having up to 36 carbon atoms, optionally one or more oxygen and/or nitrogen atoms, and at least one reactive functional group. When the first and second functional groups react, they form a covalent bond and link the D and E compounds.

Examples of useful functional groups include hydroxyl, secondary amino, azlactyl, oxazolinyl, acetyl acetonyl, carboxyl, isocyanato, epoxy, aziridinyl, acyl halide, vinyloxy, and cyclic anhydride groups. Preferred among these are isocyanato, hydroxyl, carboxyl, and vinyloxy groups. Where the D or E compound comprises an isocyanato group, the other preferably comprises a secondary amino or hydroxyl group; where the D or E compound comprises a hydroxyl group, the other preferably comprises a carboxyl, isocyanato, epoxy, anhydride, or azlactyl group; where the D or E compound comprises a carboxyl group, the other preferably comprises a hydroxyl, amino, epoxy, vinyloxy, or oxazolinyl group; and where the D or E compound comprises a vinyloxy group, the other preferably comprises a carboxyl group.

Representative examples of useful D compounds include hydroxyalkyl (meth)acrylates such as 2-hydroxyethyl (meth)acrylate and 2-(2-hydroxyeth-oxy)ethyl (meth) acrylate; aminoalkyl (meth)acrylates such as 3-aminopropyl (meth)acrylate and 4-aminostyrene; aziactyl-substituted compounds such as 2-ethenyl-1,3-oxazolin-5-one and 2-propenyl-4,4-dimethyl-1,3-oxazolin-5-one; carboxy-substituted compounds such as (meth)acrylic acid and 4-carboxyben-zyl (meth)acrylate; isocyanato-substituted compounds such as isocyanatoethyl (meth)acrylate and 4-isocyanatocyclohexyl (meth)acrylate; epoxy-substituted compounds such as glycidyl (meth)acrylate; aziridinyl-substituted compounds such as N-acryloylaziridine and 1-(2-propenyl)-aziridine; and acyl halides such as (meth) acryloyl chloride.

Representative examples of E compounds include functional group-substituted hydrogen abstracting compounds such as (4-hydroxyphenyl)-phenylmethanone, (4-aminophenyl)phenylmethanone, 4-hydroxyphenyl4-methoxyphenylmethanone, 2-hydroxyphenyl-2,4-dimethoxyphenylmethanone, 4-isocyanatophenyl4-phenylmethanone, 2-hydroxyxanthone, 2-hydroxythio-xanthone, and 4-hydroxyxanthone.

Examples of C monomers prepared from D and E compounds are given below in Table I. Those skilled in the art will recognize the starting materials used for each listed C monomer and how other C monomers can be prepared through the use of other coreactive D and E compounds.

Preferably, a saturated energy-activated initiator of polymerization (i.e., a source of free radicals other than a C monomer) is used in forming the polymer component of the syrup of the present invention from the solvent monomer component. These energy-activated sources can be either heat- or UV radiation-activated. Examples of heat-activated sources include benzoyl peroxide, t-butyl perbenzoate, cumene hydroperoxide, azobis(isobutyronitrile), and methyl ethyl ketoperoxide. Useful UV radiation-acticviated initiators include the benzoin ethers such as benzoin methyl ether and benzoin ispropyl either; substituted acetophenones such as 2,2-diethoxyacetophenone, commercially available as Irgacure™ 651 photoinitiator (Ciba-Geigy Corp.; Ardsley, N.Y.), 2,2-dimethoxy-2- phenyl-1-phenylethanone, commercially available as Esacure™ KB-1 photo-initiator (Sartomer Co.; West Chester, Pa.), and dimethoxyhydroxy-acetophenone; substituted α-ketols such as 2-methyl-2-hydroxy propiophenone; aromatic sulfonyl chlorides such as 2-naphthalenesulfonyl chloride; and photoactive oximes such as 1-phenyl-1,2-propanedione-2-(O-ethoxycarbonyl) oxime. Particularly preferred among these are the substituted acetophenones. A saturated energy-activated source of free radicals can be present in an amount from 0.0001 to about 3 pbw, preferably from about 0.001 to about 1.0 pbw, more preferably from about 0.005 to about 0.5 pbw, per 100 pbw of the solvent monomer mixture.

When present and upon activation through introduction of appropriate energy, the saturated energy-activated initiator of polymerization initiates the polymerization of the free radically-polymerizable ethylenically unsaturated monomers (i.e., the A and B monomers). When ethylenically unsaturated monomers comprising a radiation-sensitive hydrogen abstracting group (i.e., C monomers) are also present, they also can be incorporated into the backbone chain of the polymer, resulting in radiation-sensitive hydrogen abstracting groups pendent from the backbone chain.

Where a saturated heat-activated initiator is used with a monomer mixture that includes at least one C monomer, the syrup can be exposed to heat only or to heat and UV radiation so as to initiate polymerization of the monomer mixture.

Inclusion of unsaturated α-cleaving monomers and/or polyunsaturated monomers will provide a polymer with

TABLE I

Examples of C monomers pendent groups that include α-cleaving or unsaturated groups, respectively. Those groups can then be activated by means known in the art to allow for further polymerization, normally after the monomer-polymer composition (i.e., syrup) has been coated onto a substrate.

One or more free radically-polymerizable polyethylenically unsaturated monomers can be included in the monomer mixture or, preferably, added to the syrup. Use of such monomer(s) allows for a reduction in the amount of ethylenically unsaturated monomer comprising a radiation-sensitive hydrogen abstracting group necessary to produce the viscoelastomeric material of the present invention. Examples of polyethylenically unsaturated monomers that can be used include, but are not limited to, polyacrylic-functional monomers such as ethylene glycol diacrylate, propyleneglycol dimethacrylate, trimethylolpropane triacrylate, 1,6-hexamethylenedioldiacrylate, pentaerythritol di-, tri-, and tetraacrylate, and 1,12-dodecanediol diacrylate; olefinic-acrylic-functional monomers such as allyl methacrylate, 2-allyloxycarbonylamidoethyl methacrylate, and 2-allylaminoethyl acrylate; allyl 2-acrylamido-2,2-dimethylacetate; divinylbenzene; and the like.

If desired, microspheres can be added to the syrup of the present invention. When microspheres are used, the resultant viscoelastomeric material has a foam-like appearance. These microspheres can be made from materials such as glass and polymers.

Glass microspheres, as described in U.S. Pat. No. 4,223,067, can have an average diameter of from about 5 to 200 mm, preferably from about 20 to about 80 mm. Such microspheres can comprise from 5 to 65% (by vol.) of the viscoelastomeric material of the present invention. Preferably, a coated layer of the viscoelastomeric material is at least three times as thick, preferably at least seven times thick, as the diameter of the glass microspheres.

Alternatively, hollow polymeric microspheres having average diameters of from 5 to 200 mm can be blended into the syrup of the present invention in amounts of from about 15 to about 75% (by vol.) prior to coating. Where such polymeric microspheres are used, they can be added into the syrup in an unexpanded form and subsequently heated to cause expansion. However, expanding them prior to addition is generally preferred because this helps to ensure that the hollow microspheres are substantially surrounded by at least a thin layer of viscoelastomeric material in the final article. Useful polymeric microspheres are described in U.S. Pat. Nos. 3,615,972, 4,075,238, and 4,287,308. Hollow polymeric microspheres are available under the tradename Expancel™ (Eka Nobel Inc.; Marietta, Ga.). In expanded form, they have a specific density of approximately 0.02 to 0.036 g/cm$^3$.

A particularly useful adjuvant is fumed silica, especially hydrophobic silica as disclosed in U.S. Pat. Nos. 4,710,536 and 4,749,590. In another embodiment of the present invention, a layer of the viscoelastomeric material can contain from about 2 to about 15 pbw of hydrophobic silica having a surface area of at least 10 m$^2$/g.

Other useful adjuvants that can be blended into the syrup of the present invention include fillers, dyes, pigments, plasticizers, fibrous reinforcing agents, woven and non-woven fabrics, foaming agents, antioxidants, stabilizers, fire retardants, tackifiers, electrically conductive particles and viscosity adjusting agents. If so desired, chain transfer agents can also be added so as to keep the molecular weight of the solute polymer below a desired value. Those skilled in the art with recognize that the amount of such adjuvants can vary from about 0.1 to 50% (by wt.), depending on the desired end use.

Although viscoelastomeric films can be prepared directly from the solvent monomer mixture (by quickly polymerizing a coated layer of the monomer to a polymer/monomer mixture), increasing the viscosity of the monomer mixture to a level more suitable for coating is preferred. This is readily accomplished by exposing the monomer(s) to a source of energy until about 0.1 to 35% (by wt.), preferably about 1 to 10% (by wt.), more preferably about 3 to 7% (by wt.), of the monomers have polymerized. If the source of energy is heat, a heat-activated initiator of free radicals can be included in the composition. If the source of energy is UV radiation, a radiation-activated source of free radicals can be used but is not absolutely required where a monomer of the monomer mixture contains a radiation sensitive group that produces free radicals on exposure to suitable radiation. Use of a radiation-activated source of free radicals is preferred in such situations, however.

The composition (i.e., syrup) of the present invention is preferably prepared in situ by mixing one or more free radically-polymerizable ethylenically unsaturated monomers and 0 to 3 pbw of one or more of the above-described C monomers and then polymerizing the monomer(s) to form a solute polymer. The monomers can be added in any order. Where no C monomer is present in the monomer mixture from which the syrup is formed (i.e., no radiation-sensitive hydrogen abstracting groups are present in either the solute polymer or the solvent monomer mixture), some of these groups must be introduced into the syrup prior to formation of the viscoelastomeric material. This can be done by adding C monomer to the composition after formation of the solute polymer or by adding to the syrup a second polymer (made separately from the syrup) that contains mer units with the above-described radiation-sensitive hydrogen abstracting groups pendent therefrom. Adjuvants, when desired, can thereafter be blended into the mixture.

The in situ preparation of the composition just described allows for the production and solubilization of very high molecular weight polymers. Such polymers preferably-have a molecular weight of at least 500,000, more preferably at least 750,000, even more preferably at least 1,000,000, most preferably at least 1,500,000. The solubilization of a separately made polymer of such a high molecular weight is very difficult. Therefore, the above-described in situ preparation method is the preferred manner of making the composition of the present invention.

A syrup of a coatable viscosity can be applied to a substrate, preferably a flexible carrier web, using any conventional coating means such as roller coating, dip coating, knife coating, and extrusion coating. The substrate can further comprise a release coating between the substrate and the syrup or on the side of the substrate opposite the side on which the syrup is coated.

Once a syrup has been prepared, a crosslinked viscoelastomeric material can be prepared therefrom in a variety of ways. In each method, however, the remaining monomer(s) in the syrup are polymerized by exposure to radiation that activates the hydrogen abstracting groups and facilitates crosslinking.

One way to make the viscoelastomeric material from the remaining monomer(s) is to irradiate the syrup with both high and low intensity UV radiation. Low intensity radiation is defined as 10 mW/cm$^2$ or less (as measured in accordance with procedures approved by the United States National Institute of Standards and Technology as, for example, with a UVIMAP™ UM 365 L-S radiometer manufactured by Electronic Instrumentation & Technology, Inc., in Sterling, Va.), preferably in the wavelength region of 200 to 600 nm, preferably 280 to 400 nm. High intensity radiation is defined as anything greater than 10 mW/cm$^2$, preferably between 15 and 450 mW/cm$^2$. When such radiation is used, the viscoelastomeric material can be formed directly from the syrup.

Other ways of making the viscoelastomeric material involve initially exposing the syrup to only low intensity radiation. Syrup formulations that produce high performance viscoelastomeric materials will depend on the particular crosslinker (i.e., C monomer) and its ability to be activated by the particular radiation used. Generally, where the percentage (by wt.) of mer units derived from the C monomer is about 0.2% or greater and C monomer is used in conjunction with a polyethylenically unsaturated monomer (e.g., a multifunctional acrylate), this low intensity exposure is sufficient to make a viscoelastomeric material with balanced PSA properties. Where the percentage (by wt.) of mer units derived from the C monomer is less than about 0.2%, however, further processing is preferable. Specifically, exposure to low intensity light is preferably followed by exposure to high intensity radiation so as to form a crosslinked viscoelastomeric material having balanced properties.

Polymerization is preferably performed in an inert (i.e., oxygen free) atmosphere, such as a nitrogen atmosphere. Tolerance to oxygen can be increased by including in the syrup an oxidizable tin compound, as is taught in U.S. Pat. No. 4,303,485, the teaching of which is incorporated herein by reference.

The syrup of the present invention can be cured in air by covering a layer of the photoactive coating with a plastic film that is substantially transparent to UV radiation but impervious to oxygen and irradiating the composition through that film using UV lamps that emit light in the wavelength range corresponding to the absorption maximum of the hydrogen abstracting groups and saturated photoinitiator. Several different commercially available lamps, including medium pressure mercury lamps and low-intensity fluorescent lamps, can be used. The radiation intensity of these lamps is preferably adjusted so that the radiation intensity at the surface of the coating is less than 20 mW/cm$^2$, preferably 0.5 to 6 mW/cm$^2$, each having emission maxima between 200 and 600 nm, preferably between 280 and 400 nm. Maximum efficiency and rate of polymerization is dictated by the relationship between emission properties of the radiation source and absorption properties of the photoactive compounds employed.

Where the saturated energy-activated initiator in the syrup of the present invention is heat-activated, the syrup preferably is exposed to a heat source either before or simultaneously with exposure to radiation of a wavelength that activates the hydrogen abstracting groups present in the monomer and/or the polymer of the syrup.

Where the energy-activated initiator in the syrup of the present invention is a saturated UV radiation-activated initiator, the syrup preferably is exposed first to a wavelength of radiation that activates the saturated initiator until the monomers polymerize to a coatable viscosity so that the syrup can be coated on a substrate. This coated composition is exposed to radiation of a wavelength to which at least the hydrogen abstracting group of the C monomer is sensitive at an intensity of less than 10 mW/cm$^2$ (for a total dose of 30 to 800 mJ/cm$^2$) so as to further polymerize the monomers as well as crosslink the polymer chains.

Extent of polymerization can be monitored by measuring the refractive index of the adhesive layer. Refractive index is a sensitive measure of the extent of polymerization. This method is commonly applied in polymerization kinetics work. See, for example, discussions about the method in *Polymerization at Advanced Degrees of Conversion*, G. P. Gladyshev and K. M. Gibov, Keter Press, Jerusalem (1970).

Where the crosslinked viscoelastomeric material of the present invention is a PSA, it displays balanced properties (i.e., a good combination of adhesion, cohesion, stretchiness, and elasticity). This is believed to result from the crosslinked nature of the viscoelastomeric material. Crosslinking in the present invention is quite different from the conventional mechanism of crosslinking provided by diacrylates where an increase in concentration of diacrylate results in a concomitant reduction in peel adhesion strength without an increase in static shear strength.

A multilayered tape that includes at least one cured layer derived from the syrup of the present invention is also within the scope of the present invention. Such tapes can have a thin layer of a different pressure sensitive adhesive laminated thereto, so that the adhesive of the invention is being used as a backing or core layer. The additional layer(s) can be any conventional adhesive known in the art; however, (meth) acrylic adhesives are preferred. Such multilayered constructions can be prepared by processes disclosed in U.S. Pat. Nos. 4,818,610, 4,894,259, and 4,895,738, the teachings of which are incorporated herein by reference. More preferably, additional adhesive layers include polymers of at least one alkyl (meth)acrylate monomer and a copolymerizable monomer hompolymerizable to a polymer with a $T_g$ above about 50° C.

Multilayered tapes where a layer of a polyurethane, polychloroprene, polyacrylic foam, or polyethylene foam on which is coated a layer of the viscoelastomeric material of the present invention are also possible. Such tapes are often used to attain very high bond strengths. Further information about such constructions can be found in, for example, U.S. Pat. Nos. 3,565,247, 3,993,833, and 4,415,615, the teachings of which are incorporated herein by reference.

When the coated films of the present invention are cured, they preferably have a percent gel (corrected for any soluble tackifying resins and other additives) in the range of from 2 to 95% (by wt.), more preferably from 30 to 90% (by wt.), and most preferably from 50 to 80% (by wt.).

The compositions of the present invention can also be used to make a cellular PSA membrane as is described in U.S. Pat. No. 4,415,615, the teaching of which is incorporated herein by reference.

Objects and advantages of this invention are further illustrated by the following examples. The particular materials and amounts thereof, as well as other conditions and details, recited in these examples should not be used to unduly limit this invention.

EXAMPLES

The following tests were used to evaluate PSA tapes made from syrups of the present invention.

A. Static Shear Strength

Stainless steel substrates were cleaned once with acetone and three times with a 50:50 water-isopropanol solution.

The adhesive films described in the examples were cut into 2.54 cm×1.27 cm strips and adhered to the pieces of stainless steel for about four hours. A 0.13 mm anodized aluminum backing was used for each of the adhesive samples.

Each sample was placed either at room temperature (RT) or in an air-circulating oven that had been preheated to 70° C. A weight was hung from the free end of the tape, with the sample tilted 2° from vertical to eliminate any peel forces. Two tests were performed for each adhesive sample and the average value is reported in the examples below. The time (in minutes) at which the weight fell was designated the static sheet RT (1000 g) or 70° C. (500 g). The test was discontinued after 10,000 minutes if no failure had occurred.

B. Peel Strength

Unless otherwise indicated, measurements were made using a 90° peel mode at 30.5 cm/min. In the examples below, results are in N/dm.

Pieces of stainless steel were washed once with acetone and three times with a 50:50 water-isopropanol solution. Each adhesive film was adhered to a stainless steel backing for three days prior to being tested. Each sample was about 1.3 cm wide and had a 0.13 mm anodized aluminum backing (about 1.6 cm wide).

EXAMPLES 1–7

Acryloxybenzophenone

To a series of glass jars were added 90 pbw isooctyl acrylate (hereinafter "IOA", prepared according to methods known in the art), 10 pbw acrylic acid (hereinafter "AA"), 0.04 parts per hundred (pph) 2,2-dimethoxy-2-phenyl-1-phenylethanone (Ciba-Geigy), and varying amounts of acryloxybenzophenone (hereinafter "ABP", made according to procedures known in the literature). Each jar was purged with nitrogen and the contents exposed to low intensity UV radiation so as to partially polymerize the monomers and form coatable mixtures (i.e., compositions having viscosities of about 3000 cP). An additional 0.16 pph 2,2-dimethoxy-2-phenyl-1-phenylethanone and varying amounts of 1,6-hexa-methylenedioldiacrylate (hereinafter "HDDA") were then added to each mixture.

Each mixture was coated on polyethylene-coated silicone-treated paper release liner (commercially available from a variety of sources) at a thickness of 0.13 mm. While the oxygen level of the curing chamber was maintained at 250±20 ppm, each coated mixture was then exposed to low intensity radiation for about 145 seconds, the first one-third of that time at an intensity of 1.9 mW/cm$^2$ (measured in accordance with the previously described NIST standards) and the remainder of that time at an intensity of 4.2 mW/cm$^2$. Some of the coateed mixtures were also exposed for about five seconds to high intensity radiation, which had an average intensity of 112 mW/Cm$^2$.

TABLE II

| Example No. | Amt. ABP (pph) | Amt. HDDA (pph) | High intensity radiation? | Shear Strength (min) RT | Shear Strength (min) 70° C. | Peel strength (N/dm) |
|---|---|---|---|---|---|---|
| C1 | 0 | 0.1 | No | 10,000+ | 158 | 170 |
| C2 | 0.2 | 0 | No | 6 | 4 | 88 |
| 1 | 0.2 | 0.05 | No | 10,000+ | 10,000+ | 230 |
| 2 | 0.3 | 0.05 | No | 10,000+ | 10,000+ | 230 |
| 3 | 0.045 | 0.05 | No | 5110 | 116 | 210 |
| C3 | 0 | 0.1 | Yes | 10,000+ | 141 | 200 |
| C4 | 0.1 | 0 | Yes | 830 | 21 | 190 |
| 4 | 0.25 | 0.05 | Yes | 10,000+ | 10,000+ | 180 |
| 5 | 0.126 | 0.05 | Yes | 10,000+ | 10,000+ | 190 |
| 6 | 0.0075 | 0.05 | Yes | 10,000+ | 512 | 210 |
| 7 | 0.025 | 0 | Yes | 10,000+ | 10,000+ | 160 |

When only HDDA or ABP individually is used along with only low intensity radiation (Examples C1 and C2), one does not obtain a PSA with high shear strengths at both ambient and elevated temperatures as well as high peel strength. When ABP and HDDA are used in combination with only low intensity radiation (Examples 1 and 2), one does obtain a PSA with balanced properties. Example 3 shows that, where high intensity radiation is not used, low levels of ABP are not preferred if a PSA with high shear strength is desired.

When only HDDA or a small amount (e.g., up to about 0.1 pph) of ABP individually is used along with both low and high intensity radiation (Examples C3 and C4), one still does not obtain a PSA with balanced properties. However, one does obtain a PSA with balanced properties when HDDA and ABP are used in conjunction along with a combination of low and high intensity radiation (Examples 4 and 5) unless too small of an amount of ABP is used (Example 6). When a moderate amount of ABP is used along with both low and high intensity radiation, a PSA with good shear properties can be obtained, although such a PSA has a lower peel strength than a similar PSA containing HDDA (Example 7). Therefore, using ABP in combination with a polyunsaturated monomer such as HDDA is generally preferred.

EXAMPLES 8–15

Acrylamidobenzophenone

To a 250 mL round bottom flask were added 6.95 g (0.05 mole) 2-vinyl-4,4-dimethylaziactone (SNPE, Inc.; Princeton, N.J.), 9.90 g (0.05 mole) 4-hydroxy-benzophenone (Aldrich Chemical Co.; Milwaukee, Wis.), and 50 acetate. This solution was magnetically stirred at room temperature while 0.38 g (0.00025 mole) 1,8-diazabicyclo[5.4.0]undec-7-ene (Aldrich Chemical Co.) was added. The solution immediately turned yellow and, within 30 minutes, an insoluble powdery white solid formed. This solid was collected by filtration, washed with cold ethyl acetate, and dried in vacuo. A total of 12.45 g was collected (74% yield), a sample of which was found to have a melting point of 131–131.5° C. IR and NMR spectroscopy was used to identify the product as 4-[2-(N-propenoyl)amino-2-methylpropanoyloxy]benzophenone, called acrylamidobenzophenone or "AcBP" below.

To a series of glass jars were added 90 pbw IOA, 10 pbw AA, 0.04 pph 2,2-dimethoxy-2-phenyl-1-phenylethanone, and varying amounts of the above-described AcBP. Each jar was purged with nitrogen and the contents exposed to low intensity UV radiation so as to partially polymerize the monomers and form coatable mixtures. An additional 0.10 pph 2,2-dimethoxy-2-phenyl-1-phenylethanone was then added to each mixture.

Each mixture was coated on polyethylene-coated silicone-treated paper release liner at a thickness of 0.13 mm. While the oxygen level of the curing chamber was maintained at 220±20 ppm, each coated mixture was then exposed to low intensity radiation for about 105 seconds at an average intensity of 4.6 mW/cm$^2$. Some of the coated mixtures were also exposed to high intensity radiation until an additional 347 mJ/cm$^2$ of energy had been applied.

TABLE III

| | AcBP | | | | | |
|---|---|---|---|---|---|---|
| | AcBP (pph) | | | Shear Strength (min) | | Peel strength |
| Ex. No | Added to monomers | Added to syrup | High intensity radiation? | RT | 70° C. | (N/dm) |
| 8 | 0.1 | 0 | No | 54 | 2 | 159 |
| 9 | 0.3 | 0 | No | 111 | 9 | 157 |
| 10 | 0 | 0.1 | No | 109 | 9 | 147 |
| 11 | 0 | 0.3 | No | 159 | 12 | 170 |
| 12 | 0.1 | 0 | Yes | 10,000+ | 2418[a] | 129 |
| 13 | 0.3 | 0 | Yes | 10,000+ | 10,000+ | 149 |
| 14 | 0 | 0.1 | Yes | 10,000+ | 10,000+ | 160 |
| 15 | 0 | 0.3 | Yes | 10,000+ | 2888[a] | 155 |

[a]Pop-off failure.

The data of Table III show that AcBP-containing PSAs with high shear values can be prepared only when high intensity radiation is used in combination with low intensity radiation. PSAs with balanced properties can be obtained using a relatively large amount of AcBP in the initial monomer mixture or by adding a relatively small amount of AcBP to an already-made syrup. A polyunsaturated monomer such as HDDA need not be included to obtain a PSA with balanced properties.

EXAMPLES 16–24

Acrylamidobenzophenone in a Tackified Acrylate

To a series of glass jars were added 81 pbw IOA, 1.5 pbw AA, 18.5 pbw isobornyl acrylate (hereinafter "IBA"), 0.04 pph 2,2-dimethoxy-2-phenyl-1-phenylethanone, and varying amounts of AcBP. Each jar was purged with nitrogen and the contents exposed to low intensity UV radiation so as to partially polymerize the monomers and form coatable mixtures. An additional 0.20 pph 2,2-dimethoxy-2-phenyl-1-phenylethanone, varying amounts of HDDA, and varying amounts of Regalrez™ 6108 tackifier (Hercules Co.; Wilmington, Del.) were then added to each mixture.

Each mixture was coated on polyethylene-coated silicone-treated paper release liner at a thickness of 0.13 mm. While the oxygen level of the curing chamber was maintained at 100±20 ppm, each coated mixture was then exposed intensity radiation for about 100 seconds at an average intensity of 4.8 mW/cm$^2$. The coated mixtures were also exposed to high intensity radiation (i.e., 71 mW/cm$^2$) for 12 seconds.

In addition to peel tests on stainless steel, peel tests on polypropylene ("PP") substrates were also performed. (The same procedure was used to adhere samples to stainless steel was used to adhere samples to polypropylene.). Each polypropylene substrate was cleaned three times with heptane before application of adhesive. Additionally, only a twenty minute dwell time was observed before testing.

TABLE IV

| Example No. | AcBP (pph) | HDDA (pph) | Tackifier (pph) | Shear Strength (min) | | Peel Strength (N/dm) | |
|---|---|---|---|---|---|---|---|
| | | | | RT | 70° C. | St. steel | PP |
| 16 | 0.10 | 0 | 20 | 18 | 1 | 73.6 | 76.4 |
| 17 | 0.10 | 0.04 | 20 | 54 | 3 | 66.5 | 72.9 |
| 18 | 0.10 | 0.12 | 20 | 3412 | 381 | 65.1 | 78.1 |
| 19 | 0.16 | 0 | 20 | 34 | 1 | 68.3 | 98.4 |
| 20 | 0.16 | 0.04 | 20 | 146 | 7 | 67.9 | 103 |
| 21 | 0.16 | 0.12 | 20 | 10,000+ | 10,000+ | 77.1 | 92.5 |
| 22 | 0.16 | 0 | 30 | 55 | 1 | 69.4 | 81.6 |
| 23 | 0.16 | 0.04 | 30 | 1983 | 137 | 78.1 | 82.3 |
| 24 | 0.16 | 0.12 | 30 | 10,000+ | 10,000+ | 71.5 | 75.0 |

The data of Table IV show that, in systems containing tackifiers, higher levels of AcBP and HDDA are required to obtain high static shear values.

EXAMPLES 25–28

Acrylamidobenzophenone in conjunction with a Multifunctional Acrylate

To a series of glass jars were added 90 pbw IOA, 10 pbw AA, 0.04 pph 2,2-dimethoxy-2-phenyl-1-phenylethanone, 15 pph KE 311™ tackifier (Arakawa Chemical Co.; Chicago, Ill.), 0.05 pph HDDA, and varying amounts of AcBP. Each jar was purged with nitrogen and the contents exposed to low intensity UV radiation so as to partially polymerize the monomers and form coatable mixtures. An additional 0.16 pph 2,2-dimethoxy-2-phenyl-1-phenylethanone and varying amounts of HDDA were added to each mixture.

Each mixture was coated on polyethylene-coated silicone treated paper release liner at a thickness of 0.13 mm while the oxygen level of the curing chamber was maintained at about 100 ppm, each coated mixture was exposed to low intensity radiation for about 105 seconds at an average intensity of 4.6 mW/cm$^2$. An 843 mJ/cm$^2$ high intensity exposure at an average intensity of 102 mW/cm$^2$ was thereafter applied.

The test procedures were the same as described above with the exception that the stainless steel peel test were performed 20 minutes after the adhesive films were applied to the substrates.

TABLE V

| | AcBP and HDDA | | | | |
|---|---|---|---|---|---|
| Sample | AcBP (pph) | HDDA, added to syrup | Stainless Steel Peel (N/dm) | Shear Values (min) | |
| | | | | RT | 70° C. |
| 25 | 0.10 | 0.05 | 75.7 | 10,000+ | 10,000+ |
| 26 | 0.10 | 0.10 | 76.7 | 10,000+ | 10,000+ |
| 27 | 0.40 | 0.05 | 86.2 | 5490[a] | 10,000+ |
| 28 | 0.40 | 0.10 | 80.2 | 10,000+ | 10,000+ |

[a]Pop-off failure.

EXAMPLES 29–48

To a series of glass jars were added 90 pbw IOA, 10 pbw AA, and 0.04 pph 2,2-dimethoxy-2-phenyl-1-phenylethanone. Various amounts of the C monomers shown below were added to some of the jars.

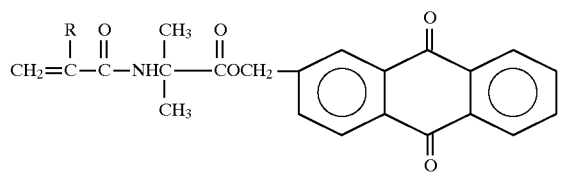

R = H in Examples 29–38
CH₃ in Examples 39–48

(In other of the jars, the C monomer was not added until after the contents of the jar had been partially polymerized so as to provide a syrup.) Each jar was purged with nitrogen and the contents exposed to low intensity UV radiation so as to partially polymerize the monomers and form coatable mixtures. To each mixture was added an additional 0.12 pph 2,2-dimethoxy-2-phenyl-1-phenylethanone, 0.05 pph HDDA, and, to the jars to which no C monomer had previously been added, varying amounts of C monomer.

Each mixture was coated on polyethylene-coated silicone treated paper release liner at a thickness of 0.13 mm while the oxygen level of the curing chamber was maintained at about 250 ppm, each coated mixture was exposed to low intensity radiation for about 100 seconds at an average intensity of 2.0 mW/cm². Both shear strength and peel strength measurements were then taken. A 280 mJ/cm² high intensity exposure at an average intensity of 18 mW/cm² was thereafter applied and the peel strength values were again measured.

The test procedures were the same as described above with the exception that the stainless steel peel test were performed 20 minutes after the adhesive films were applied to the substrates.

TABLE VI

| | C monomer (pbw) | | Shear | | Peel Strength (N/dm) | |
|---|---|---|---|---|---|---|
| Ex. No. | Added to the monomer mixture | Added to the syrup | Strength (min) RT | 70° C. | Low int. rad. only | Low and high int. rad. |
| 29 | 0.0075 | — | 4571 | 48 | 139 | 146 |
| 30 | 0.05 | — | 10,000+ | 524 | 139 | 123 |
| 31 | 0.10 | — | 10,000+ | 10,000+ | 132 | 129 |
| 32 | 0.15 | — | 10,000+ | 10,000+ | 101 | 109 |
| 33 | 0.20 | — | 10,000+ | 10,000+ | 103 | 90 |
| 34 | — | 0.0075 | 10,000+ | 177 | 147 | 167 |
| 35 | — | 0.05 | 10,000+ | 156 | 143 | 161 |
| 36 | — | 0.10 | 10,000+ | 117 | 134 | 150 |
| 37 | — | 0.15 | 10,000+ | 124 | 142 | 156 |
| 38 | — | 0.20 | 10,000+ | 395 | 127 | 135 |
| 39 | 0.0075 | — | 10,000+ | 66 | 127 | 149 |
| 40 | 0.05 | — | 10,000+ | 10,000+ | 137 | 151 |
| 41 | 0.10 | — | 10,000+ | 10,000+ | 126 | 119 |
| 42 | 0.15 | — | 10,000+ | 10,000+ | 110 | 103 |
| 43 | 0.20 | — | 10,000+ | 10,000+ | 81 | 80 |
| 44 | — | 0.0075 | 10,000+ | 95 | 156 | 157 |
| 45 | — | 0.05 | 10,000+ | 127 | 152 | 156 |
| 46 | — | 0.10 | 10,000+ | 305 | 144 | 151 |
| 47 | — | 0.15 | 10,000+ | 106 | 124 | 127 |
| 48 | — | 0.20 | 10,000+ | 100 | 132 | 140 |

The data of Table VI show that adhesives with better high temperature shear values are obtained when ethylenically unsaturated monomer comprising a radiation-sensitive hydrogen abstracting group (i.e., a C monomer) is added to the monomer mixture rather than to the syrup. Nevertheless, adhesives with good low temperature shear values can be obtained when C monomer is added to the syrup.

EXAMPLES 49–60

Thermal Initiation

Into a glass bottle were charged 90 g IOA, 10 g AA, 5 g 2,2'-azobis(isobutyronitrile), commercially available as VAZO 64™ free radical initiator (DuPont; Wilmington, Del.). The bottle was purged with nitrogen and sealed before being placed in a 60° C. bath and tumbled for 24 hours. A comparative (i.e., control) syrup having an inherent viscosity of 0.82 dl/gm was recovered.

Syrups that included copolymers of IOA, AA and various C monomers were prepared as above. Each of these syrups was coated onto 37 μm polyester substrates to provide dry coating thicknesses of 50 μm. The coated films were cured to PSAs by exposure to approximately 200 mJ from one of three types of bulbs: "H bulb" (200–350 nm), "Q bulb" (330–450 nm), or "V bulb" (350–470 nm).

The PSA samples were tested under constant temperature and humidity. Shear strength tests were performed as described previously. Peel strength tests were performed at 180° using a tester speed of 30.5 cm/min. The results are shown below in Table VII.

TABLE VII

| | | | Shear Strength (min) | | 180° Peel |
|---|---|---|---|---|---|
| Ex. No. | C monomer | Bulb | RT | 70° C. | Strength (N/dm) |
| 49 | a | H | 10,000+ | 10,000+ | 31.5 |
| 50 | a | Q | 10,000+ | 10,000+ | 21.2 |
| 51 | a | V | 10,000+ | 10,000+ | 18.2 |
| 52 | b | H | 10,000+ | 10,000+ | 9.5 |
| 53 | b | Q | 10,000+ | 10,000+ | 33.8 |
| 54 | b | V | 10,000+ | 10,000+ | 18.5 |
| 55 | c | H | 10,000+ | 10,000+ | 27.0 |
| 56 | c | Q | 10,000+ | 10,000+ | 35.7 |
| 57 | c | V | 10,000+ | 10,000+ | 26.4 |
| 58 | d | H | 10,000+ | 10,000+ | 27.9 |
| 59 | d | Q | 10,000+ | 10,000+ | 8.2 |
| 60 | d | V | 10,000+ | 10,000+ | 22.7 | a = ABP
b = AcBP
c = C monomer from Examples 29–38
d = C monomer from Examples 39–48

(Tapes with adhesive thicknesses of 125 μm gave shear strengths similar to those shown in Table VII.)

The data of Table VII show that PSAs made from syrups in which the polymer was prepared in situ by thermal initiation have excellent shear properties at both ambient and elevated temperatures.

EXAMPLE 61

3-[2-(N-2-propenyl)amino-2-methylpropanoyloxy]acetopheone (AcAc)

A mixture of 27.2 g (0.20 mol) 3-hydroxyacetophenone (Aldrich Chemical Co.), 27.8 g (0.20 mol) vinyldimethyl azlactone (SNPE, Inc.), and 0.50 g (3.3 mmol) DBU was heated at 90° C. for 18 hours. The product was recrystallized from aqueous ethanol to afford 30.7 g (55%) of the acrylamide as a white solid, with a melting point of 115°–117° C. IR and NMR spectra were consistent with those expected for the desired product.

EXAMPLES 62–67

Testing of AcAc

To a series of glass jars were added 90 pbw IOA, 10 pbw AA, and 0.04 pph 2,2-dimethoxy-2-phenyl-1- phenylethanone (Ciba-Geigy Corp.; Ardsley, N.Y.). To some of the jars were added varying amounts of AcAc. To other of the jars, ABP or AcBP was not added until after the contents of the jar had been partially polymerized so as to provide a syrup. Each jar was purged with nitrogen and the contents exposed to low intensity UV radiation so as to partially polymerize the monomers and form coatable mixtures. To each mixture was added an additional 0.12 pph 2,2-dimethoxy-2-phenyl-1-phenylethanone.

Each mixture was coated and polymerized as in Examples 8–15.

TABLE VIII

| | AcAc (pbw) | | Shear Strength (min) | |
|---|---|---|---|---|
| Example No. | Added to monomers | Added to the syrup | RT | 70° C. |
| 62 | 0.1 | — | 1105 | 25 |
| 63 | 0.3 | — | 1948 | 34 |
| 64 | 0.5 | — | 2595 | 49 |
| 65 | — | 0.1 | 4129 | 90 |
| 66 | — | 0.3 | 1883 | 105 |
| 67 | — | 0.5 | 10K+ | 4162 |

Various modifications and alterations that do not depart from the scope and spirit of this invention will become apparent to those skilled in the art. This invention is not to be unduly limited to the illustrative embodiments set forth herein.

We claim:

1. A syrup curable to a crosslinked viscoelastomeric material comprising:
   a) about 65 to 99.9 weight percent of a solvent monomer mixture comprising
      1) 95 to 99.9999 parts by weight of at least one free radically-polymerizable ethylenically unsaturated monomer, and
      2) 0.0001 to 5 parts by weight of an ethylenically unsaturated monomer comprising a radiation-sensitive hydrogen abstracting group;
   b) about 0.1 to 35 weight percent of a solute polymer comprising
      1) 9s to 99.9999 weight percent mer units derived from one or more free radically-polymerizable ethylenically unsaturated monomers, and
      2) about 0.001 to 5 weight percent mer units derived from an ethylenically unsaturated monomer comprising a radiation-sensitive hydrogen abstracting group,
   said polymer having a molecular weight of at least 500,000;
   c) from 0.01 to 5 parts by weight of a free radically-polymerizable polyethylenically unsaturated monomer selected from the group consisting of acrylate monomers and divinyl monomers; and
   d) from 0.0001 to 3 parts by weight of a saturated energy-activated initiator of polymerization;
   wherein the parts by weight of said free radically-polymerizable polyethylenically unsaturated monomer and said saturated energy-activated initiator of polymerization are based upon 100 parts by weight of said solvent monomer mixture and said solute polymer.

2. The syrup of claim 1 wherein said at least one free radically-polymerizable ethylenically unsaturated monomer of said monomer mixture comprises a monoethylenically unsaturated monomer homopolymerizable to a polymer having a glass transition temperature of less than about 0°C.

3. The syrup of claim 2 wherein said at least one free radically-polymerizable ethylenically unsaturated monomer is selected from the group consisting of isooctyl acrylate, 2-ethylhexyl acrylate, isononyl acrylate, decyl acrylate, dodecyl acrylate, hexyl acrylate, and butyl acrylate.

4. The syrup of claim 2 wherein said at least one free radically-polymerizable ethylenically unsaturated monomer further comprises a monoethylenically unsaturated monomer homopolymerizable to a polymer having a glass transition temperature of greater than about 50° C.

5. The syrup of claim 4 wherein said second monoethylenically unsaturated monomer is selected from the group consisting of (meth)acrylic acid, itaconic acid, N,N-dimethylacrylamide, N-octylacrylamide, 2-hydroxyethyl acrylate, N-vinyl pyrrolidone, N-vinyl caprolactam, acrylonitrile, tetrahydrofurfuryl acrylate, and isobornyl acrylate.

6. The syrup of claim 1 wherein said ethylenically unsaturated monomer comprising a radiation sensitive group has the formula

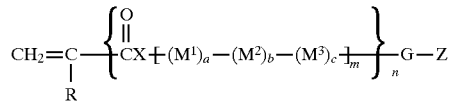

wherein
   R is H or a $C_1$ to $C_3$ alkyl group, preferably H or a methyl group;
   X is O or NH;
   n is 0 or 1;
   m is 0 or an integer from 1 to 5;
   a, b, and c are independently 0 or 1;
   $M^1$ is $CH_2$ or $SIR^1R^2$;
   $M^2$ is $CR^3R^4$ or $SiR^1R^2$;
   $M^3$ is O, NH, C(O), C(O)O, C(O)NH, or OC(O)NH;
   $R^1$ and $R^2$ are independently H or a $C_1$ to $C_4$ alkyl group;
   $R^3$ and $R^4$ are independently H, an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic 0 heteroatoms, or $R^3$ and $R^4$ taken together with the carbon to which they are attached form a carbocyclic ring containing 4 to 12 ring atoms;
   G is a covalent bond, $(CH_2)_d$, or $(CH_2)_dO$ where d is an integer from 1 to 4, preferably from 1 to 2;
   Z is a radiation-sensitive hydrogen abstracting group having the general formula

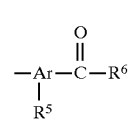

in which
   Ar is a substituted arene having 6 to 12 carbon atoms, preferably a benzenetriyl group;
   $R^5$ is hydrogen, a $C_1$ to $C_{12}$ alkyl group, a $C_1$ to $C_{12}$ alkoxy group, or a phenyl group; and
   $R^6$ is a $C_1$ to $C_6$ alkyl group, a cycloalkyl group having 3 to 14 carbon atoms, or

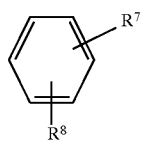

wherein
R⁷ and R⁸ are independently selected from the class consisting of hydrogen, $C_1$ to $C_{12}$ alkyl groups, $C_1$ to $C_{12}$ alkoxy groups, and phenyl groups, with the proviso that, when $R^5$ and $R^7$ (or $R^8$) are ortho to the carbonyl group of Z, together they can be one of

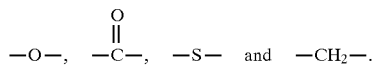

7. The syrup of claim 1 wherein said syrup comprises 0.001 to 1.0 parts by weight of said saturated energy-activated initiator of polymerization.

8. The syrup of claim 7 wherein said energy is ultraviolet radiation.

9. The syrup of claim 7 wherein said monomer mixture comprises from 0.005 to 3 parts by weight of said ethylenically unsaturated monomer comprising a radiation-sensitive hydrogen abstracting group.

10. The syrup of claim 1 wherein said syrup comprises from 0.01 to 0.30 parts by weight of said free radically-polymerizable polyethylenically unsaturated monomer.

11. The syrup of claim 1 wherein said syrup is of a coatable viscosity.

12. A process for making a crosslinked viscoelastomeric material comprising the steps;
   a) providing a composition comprising
      1) a solvent monomer mixture comprising
         (a) 100 parts by weight of at least one free radically-polymerizable ethylenically unsaturated monomer, and
         (b) 0.0001 to 5 parts by weight of an ethylenically unsaturated monomer comprising a radiation-sensitive hydrogen abstracting group, and
      2) 0.0001 to 3 parts by weight of a saturated energy-activated initiator of polymerization;
   b) exposing said composition to energy so as to partially polymerize said monomer mixture in situ to form a coatable syrup containing a polymer of a molecular weight of at least 500,000 and the polymer comprising monomers 1) (a) and 1) (b);
   c) adding to said syrup;
      1) 0 to 3 parts by weight of a saturated energy-activated initiator of polymerization.
      2) 0 to 3 parts by weight of an ethylenically unsaturated monomer comprising a radiation-sensitive hydrogen abstracting group, and
      3) 0.01 to 5 parts by weight of a free radically-polymerizable polyethylenically unsaturated monomer selected from the group consisting of acrylate monomers and divinyl monomers; and
   d) exposing said syrup to energy that activates said initiator and said hydrogen abstracting group of said ethylenically unsaturated monomer comprising a radiation-sensitive hydrogen abstracting group so as to form said crosslinked viscoelastomeric material.

13. The process of claim 12 wherein said ethylenically unsaturated monomer comprising a radiation-sensitive hydrogen abstracting group has the formula

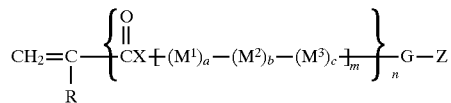

wherein
R is H or a $C_1$ to $C_3$ alkyl group, preferably H or a methyl group;
X is O or NH;
n is 0 or 1;
m is 0 or an integer from 1 to 5;
a, b, and c are independently 0 or 1;
$M^1$ is $CH_2$ or $SiR^1R^2$;
$M^2$ is $CR^3R^4$ or $SiR^1R^2$;
$M^3$ is O, NH, C(O), C(O)O, C(O)NH, or OC(O)NH;
$R^1$ and $R^2$ are independently H or a $C_1$ to $C_4$ alkyl group;
$R^3$ and $R^4$ are independently H, an alkyl group having 1 to 14 carbon atoms, a cycloalkyl group having 3 to 14 carbon atoms, an aryl group having 5 to 12 ring atoms, an arenyl group having 6 to 26 carbon and 0 to 3 S, N, and nonperoxidic O heteroatoms, or $R^3$ and $R^4$ taken together with the carbon to which they are attached form a carbocyclic ring containing 4 to 12 ring atoms;
G is a covalent bond, $(CH_2)_d$, or $(CH_2)_dO$ where d is an integer from 1 to 4, preferably from 1 to 2;
Z is a radiation-sensitive hydrogen abstracting group having the general formula

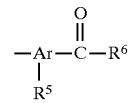

in which
Ar is a substituted arene group having 6 to 12 carbon atoms;
$R^5$ is hydrogen, a $C_1$ to $C_{12}$ alkyl group, a $C_1$ to $C_{12}$ alkoxy group, or a phenyl group; and
$R^6$ is a $C_1$ to $C_6$ alkyl group, a cycloalkyl group having 3 to 14 carbon atoms, or

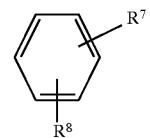

wherein
R⁷ and R⁸ are independently selected from the class consisting of hydrogen, $C_1$ to $C_{12}$ alkyl groups, $C_1$ to $C_{12}$ alkoxy groups, and phenyl groups, with the proviso that, when $R^5$ and $R^7$ (or $R^8$) are ortho to the carbonyl group of Z, together they can be one of

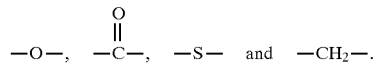

14. A syrup curable to a crosslinked viscoelastomeric material comprising:
   a) about 65 to 99.9 weight percent of a solvent monomer mixture comprising 1) 95 to 99.9999 parts by weight of at least one free radically-polymerizable ethylenically unsaturated monomer, and
2) 0.0001 to 5 parts by weight of an ethylenically unsaturated monomer comprising a radiation-sensitive hydrogen abstracting group;

b) about 0.1 to 35 weight percent of a solute polymer comprising
1) 95 to 99,9999 weight percent mer units derived from one or more free radically-polymerizable ethylenically unsaturated monomers, and
2) about 0.001 to 5 weight percent mer units derived from an ethylenically unsaturated monomer comprising a radiation-sensitive hydrogen abstracting group, said polymer having a molecular weight of at least 500,000;

c) from 0.01 to 5 parts by weight of a free radically-polymerizable polyethylenically unsaturated monomer selected from the group consisting of ethylene glycol diacrylate, propyleneglycol dimethacrylate, trimethylolpropane triacrylate, 1.6-hexamethylenedioldiacrylate, pentaerythritol di-, tri-, and tetraacrylate, 1,12-dodecanediol diacrylate, allyl methacrylate, 2-allyloxycarbonylamidoethyl methacrylate, 2-allylaminoethyl acrylate, allyl 2-acrylamido-2,2-dimethylacetate, and divinylbenzene; and d) from 0.0001 to 3 parts by weight of a saturated energy-activated initiator of polymerization;

wherein the parts by weight of said free radically-polymerizable polyethylenically unsaturated monomer and said saturated energy-activated initiator of polymerization are based upon 100 parts by weight of said solvent monomer mixture and said solute polymer.

* * * * *

UNITED STATES PATENT AND TRADEMARK OFFICE
CERTIFICATE OF CORRECTION

PATENT NO.: 5,773,485
DATED: June 30, 1998
INVENTOR(S): Greggory S. Bennett, Louis E. Winslow, and Gaddam N. Babu It is certified that error appears in the above-identified patent and that said Letters Patent is hereby corrected as shown below:

Column 21, line 44, "9s" should read --95--;

Column 23, line 34, "steps;" should read --steps:--;

Column 25, line 9, "99,9999" should read --99.9999--; and

Column 26, line 3, "1.6-" should read -- 1,6- --.

Signed and Sealed this

Tenth Day of April, 2001

Attest:

NICHOLAS P. GODICI

Attesting Officer     Acting Director of the United States Patent and Trademark Office